United States Patent
Okihara

(10) Patent No.: US 9,136,386 B2
(45) Date of Patent: Sep. 15, 2015

(54) SOI SUBSTRATE, METHOD OF MANUFACTURING THE SOI SUBSTRATE, SEMICONDUCTOR DEVICE, AND METHOD OF MANUFACTURING THE SEMICONDUCTOR DEVICE

(75) Inventor: Masao Okihara, Tokyo (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 736 days.

(21) Appl. No.: 13/362,093

(22) Filed: Jan. 31, 2012

(65) Prior Publication Data

US 2012/0193714 A1 Aug. 2, 2012

(30) Foreign Application Priority Data

Feb. 2, 2011 (JP) .................................. 2011-020521

(51) Int. Cl.
- *H01L 27/12* (2006.01)
- *H01L 29/786* (2006.01)
- *H01L 21/762* (2006.01)
- *H01L 29/66* (2006.01)
- *H01L 29/78* (2006.01)

(52) U.S. Cl.
CPC .... *H01L 29/78603* (2013.01); *H01L 21/76254* (2013.01); *H01L 21/76283* (2013.01); *H01L 29/66772* (2013.01); *H01L 27/1203* (2013.01); *H01L 29/785* (2013.01); *H01L 29/78621* (2013.01)

(58) Field of Classification Search
CPC ..... H01L 27/1203; H01L 21/84; H01L 29/78; H01L 29/785

USPC .................................................. 257/347, 410
See application file for complete search history.

(56) References Cited

U.S. PATENT DOCUMENTS

| 2002/0045317 | A1* | 4/2002 | Oishi et al. ..................... 438/300 |
| 2002/0047169 | A1* | 4/2002 | Kunikiyo ....................... 257/410 |
| 2002/0197760 | A1 | 12/2002 | Yamazaki et al. |
| 2005/0189590 | A1 | 9/2005 | Okamura |
| 2009/0117703 | A1 | 5/2009 | Yamazaki |

FOREIGN PATENT DOCUMENTS

| JP | 06-140427 | 5/1994 |
| JP | 07-183234 A | 7/1995 |
| JP | 08-018009 A | 1/1996 |
| JP | 2000-223713 A | 8/2000 |
| JP | 2003-152192 A | 5/2003 |
| JP | 2003-282878 A | 10/2003 |
| JP | 2003-289144 | 10/2003 |

(Continued)

OTHER PUBLICATIONS

Japanese Office Action dated Jan. 6, 2015.
Japanese Office Action dated Mar. 31, 2015.

*Primary Examiner* — Zandra Smith
*Assistant Examiner* — John M Parker
(74) *Attorney, Agent, or Firm* — Volentine & Whitt, PLLC

(57) ABSTRACT

An SOI substrate includes a semiconductor base; a semiconductor layer formed over the semiconductor base; and a buried insulating film which is disposed between the semiconductor base and the semiconductor layer, so as to electrically isolate the semiconductor layer from the semiconductor base, where the buried insulating film contains a nitride film.

23 Claims, 8 Drawing Sheets

(56) References Cited

FOREIGN PATENT DOCUMENTS

| | | |
|---|---|---|
| JP | 2005-244112 A | 9/2005 |
| JP | 2007-311747 A | 11/2007 |
| JP | 2009-135469 A | 6/2009 |
| WO | 2010/082498 A1 | 7/2010 |

* cited by examiner

SOI SUBSTRATE, METHOD OF MANUFACTURING THE SOI SUBSTRATE, SEMICONDUCTOR DEVICE, AND METHOD OF MANUFACTURING THE SEMICONDUCTOR DEVICE

BACKGROUND OF THE INVENTION

1. Field of the Invention

The present invention relates to semiconductor devices having element isolation regions, and to techniques for fabricating the semiconductor devices.

2. Description of the Related Art

With recent progress in enhanced performances and multi-functionalization of mobile instruments and personal audio equipments, there are strong needs of reducing power consumption and of enhancing performances of LSIs used for such instruments or equipment. CMOS devices fabricated using bulk substrate are suffering from a problem of increase in power consumption, due to higher degrees of integration and faster operational speed as a result of dimensional shrinkage of semiconductor processes. Accordingly, a CMOS device having a novel structure, operable at low power consumption, is strongly expected. In this situation, semiconductor devices (called "SOI devices") fabricated by using SOI (Silicon On Insulator or Semiconductor On Insulator) substrates having buried insulating films therein are expected as devices capable of achieving low power consumption and dimensional shrinkage of LSIs. Advantages of the SOI device reside in complete electrical isolation of elements such as PMOS transistor and NMOS transistor, and implementation of high-density layout, without causing latch-up, by virtue of provision of the buried insulating film (e.g., a BOX film).

SOI devices can be classified into partially depleted SOI (PD-SOI) devices and fully depleted SOI (FD-SOI) devices. Both types of the SOI device have a body region surrounded by a gate insulating film, a source diffusion region, a drain diffusion region, and a buried insulating film, directly under a gate electrode. The PD-SOI device has a partially-depleted body region, and suffers for example from degradation of sub-threshold characteristic (i.e., S factor) during operation of the device, due to floating body effect. On the other hand, the FD-SOI device will cause no floating body effect, since the body region is completely depleted, and has an advantage of capable of operating at low voltage and low current consumption.

The element isolation structure can be formed by LOCOS (Local Oxidation Of Silicon) or STI (Shallow Trench Isolation). LOCOS refers to a method of forming an insulating film for element isolation, by thermally oxidizing the surface of the semiconductor substrate, whereas STI refers to a method of forming a shallow trench in the semiconductor substrate, and then filling the trench with an insulating film.

Prior art documents regarding the SOI device and the element isolation techniques are exemplified by Japanese Patent Application Publication Nos. 2003-289144 and H06 (1994)-140427.

Besides the above-described element isolation techniques such as LOCOS and STI, another possible method can be used such as selective etching of the surface of a semiconductor substrate so as to form a mesa-shape semiconductor layer that is used as an active region (element region) ("mesa isolation process"). A transistor structure can be fabricated by forming a gate structure (a gate insulating film and a gate electrode) on the mesa-shape semiconductor layer, and introducing impurities into the semiconductor layer on both sides of the gate structure, to thereby form source/drain diffusion regions. The source/drain diffusion regions are electrically connected through contact plugs to upper interconnects. The contact plugs can be formed typically by selectively etching an insulating interlayer which covers the source/drain diffusion regions to thereby form contact holes, and by filling the contact holes with an electro-conductive material such as tungsten.

When the transistor structure is formed on the SOI substrate by the mesa isolation process, the semiconductor layer in the process of forming the mesa is etched, until the top surface of the buried insulating film in the SOI substrate exposes in the element isolation region, as detailed later. Formation of the transistor structure using the mesa-shape semiconductor layer is followed by a process of depositing an insulating interlayer over the entire surface, and a process of selectively etching the insulating interlayer to thereby form the contact holes which reach the source/drain diffusion regions. The contact holes can, however, occasionally be misaligned, and the region for forming the contact holes can overlap the buried insulating film which exposes in the element isolation region. In this case, element characteristics can degrade if the buried insulating film is excessively etched together with the insulating interlayer in the process of forming the contact holes.

Also in the transistor structure having the element isolation region formed by LOCOS or STI, such misalignment of the contact holes can result in overlapping of the region for forming the contact holes with the element isolation insulating film. Also in this case, the element characteristics possibly degrades if the element isolation insulating film is excessively etched together with the insulating interlayer in the process of forming the contact holes.

In view of the foregoing, it is an object of the present invention to provide a SOI substrate and a method of fabricating the same, and a semiconductor device and a method of fabricating the same which are capable of suppressing degradation of device characteristics, even if misalignment of a contact hole formed in an insulating interlayer over a substrate should occur, thus forming an overlapping region between a contact hole and an element isolation region.

SUMMARY OF THE INVENTION

According to a first aspect of the present invention, there is provided an SOI substrate which includes: a semiconductor base; a semiconductor layer formed over the semiconductor base; and a buried insulating film which is disposed between the semiconductor base and the semiconductor layer, so as to electrically isolate the semiconductor layer from the semiconductor base. The buried insulating film contains a nitride film.

According to a second aspect of the present invention, there is provided a semiconductor device which includes: the SOI substrate; and a semiconductor element structure formed on the SOI substrate.

According to a third aspect of the present invention, there is provided a method of manufacturing a semiconductor device which includes: preparing the SOI substrate; and forming a semiconductor element structure on the SOI substrate.

According to a fourth aspect of the present invention, there is provided a method of manufacturing an SOI substrate which includes: preparing a first semiconductor base which includes a semiconductor layer; forming an insulating film which includes a nitride film, on a main surface of a second semiconductor base; and bonding the insulating film on the second semiconductor base and the semiconductor layer of the first semiconductor base. The insulating film is formed so as to electrically isolate the semiconductor layer from the second semiconductor base.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 12A, 12B to FIG. 14 are cross sectional views, each schematically illustrating part of steps of fabricating the SOI substrate according to the embodiment;

DETAILED DESCRIPTION OF THE INVENTION

Figure 1:
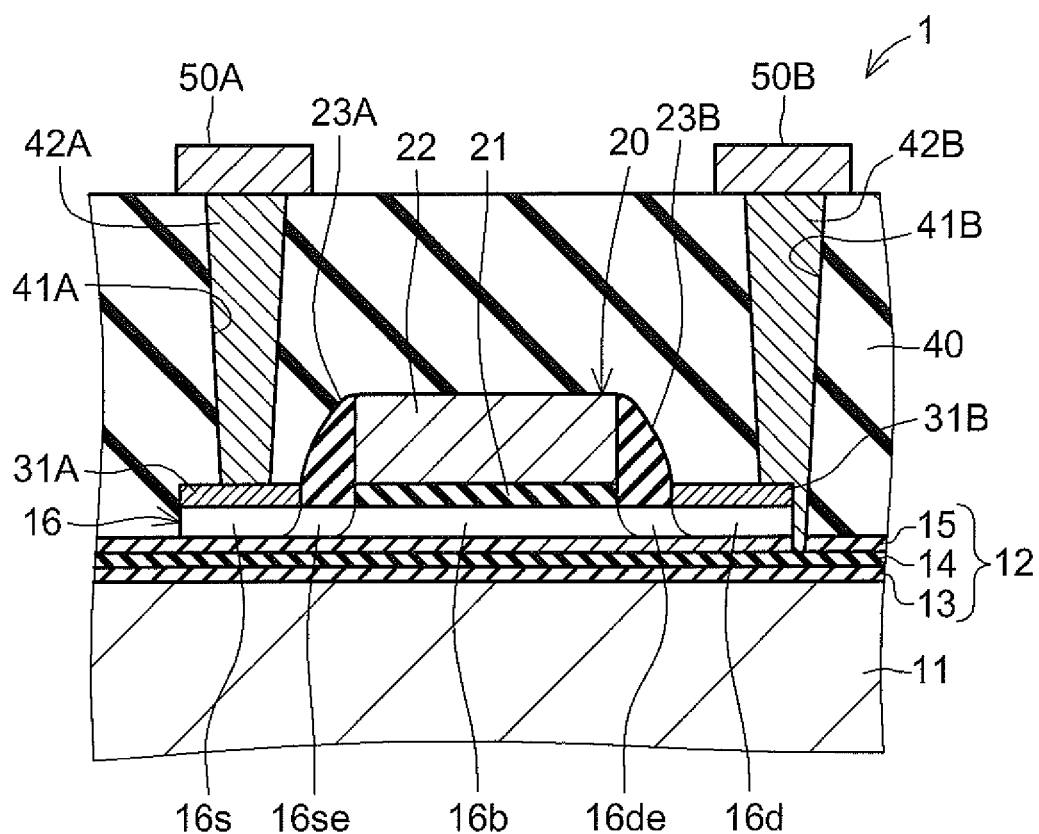
FIG. 1 is a cross sectional view schematically illustrating a structure of a semiconductor device according to an embodiment of the present invention.

Embodiments of the invention will now be described with reference to the attached drawings, in which like elements are indicated by like reference characters.

FIG. 1 is a cross sectional view schematically illustrating a structure of a semiconductor device (SOI transistor) 1 according to an embodiment of the present invention. The semiconductor device 1 has a semiconductor base (supporting substrate) 11, a buried insulating film 12 arranged on the semiconductor base 11, and a semiconductor layer (SOI layer) 16 arranged on the buried insulating film 12. The semiconductor layer 16 is a convex portion patterned into a mesa shape, on which a gate structure 20 of the SOI transistor 1 is formed. The SOI transistor 1 of the embodiment uses the mesa-shape semiconductor layer 16 as an active region (element region), wherein the mesa shape of the semiconductor layer 16 determines an element isolation region other than the active region.

The buried insulating film 12 has a function of electrically isolating the semiconductor layer 16 on the top surface from the semiconductor base 11 on the back surface, and contains a lower insulating film 13, an etching barrier film 14 and an upper insulating film 15, as illustrated in FIG. 1. The lower insulating film 13 and the upper insulating film 15 are typically composed of a silicon oxide film, whereas the etching barrier film 14 is composed of an insulating material which is more dense than the upper insulating film 15 (a nitride film, for example). As described later, the etching barrier film 14 functions as an etching stopper, when contact holes 41A, 41B are formed by anisotropic etching in an insulating interlayer 40.

The gate structure 20 is configured by a gate insulating film 21 formed on the semiconductor layer 16, a gate electrode 22 formed on the gate insulating film 21, and a pair of sidewall spacers 23A, 23B formed on both sides of the gate electrode 22. The gate insulating film 21 can have a thickness of 1 nm (nanometer) to several tens of nanometers. Constitutive materials adoptable to the gate insulating film 21 include silicon oxide, silicon nitride, and high-k material having a dielectric constant larger than that of silicon oxide (hafnium oxide-based material such as nitrogen-added hafnium silicate, for example). The gate electrode 22 can have a thickness of 50 nm to 500 nm or around, and can be formed using polysilicon heavily doped with impurity, or a refractory metal material such as titanium.

The semiconductor layer 16 has a thickness of several nanometers to several hundreds of nanometers, and is typically composed of a single-crystalline silicon material. The semiconductor layer 16 have formed therein a source diffusion region 16s and a drain diffusion region 16d having p-type or n-type conductivity, and a body region 16b held between the source diffusion region 16s and the drain diffusion region 16d. An LDD (Lightly Doped Drain) region or an extension region 16se is formed so as to extend from the source diffusion region 16s towards the drain diffusion region 16d, and an LDD region or an extension region 16de is formed so as to extend from the drain diffusion region 16d towards the source diffusion region 16s. The body region 16b in the embodiment is given as an almost completely depleted region.

On both sides of the gate structure 20 in the gate lengthwise direction, epitaxial layers 31A, 31B are formed. The epitaxial layers 31A, 31B are formed mainly for the purpose of lowering parasitic resistance.

An insulating interlayer 40 is formed so as to cover the gate structure 20, the semiconductor layer 16, and the element isolation region (the region having no mesa-shape semiconductor layer 16). The insulating interlayer 40 can typically have a thickness of 500 nm. to 1500 nm, and can be composed of an insulating material such as $SiO_2$, SiOC, SiC or SiCN. The insulating interlayer 40 has formed therein the contact holes 41A, 41B which respectively reach the top surfaces of the epitaxial layers 31A, 31B. The contact holes 41A, 41B are filled with contact plugs 42A, 42B composed of a refractory metal material such as tungsten or tantalum. The bottom ends of the contact plugs 42A, 42B are electrically connected through the epitaxial layers 31A, 31B respectively to the source diffusion region 16s and the drain diffusion region 16d, whereas the top ends of the contact plugs 42A, 42B are electrically connected to upper interconnects 50A, 50B, respectively.

In the semiconductor device 1 of the embodiment, a region for forming the contact hole 41B shifts from an exact position and overlaps the element isolation region, due to misalignment of a reticle used in a semiconductor lithographic process such as a typical photolithographic process. Accordingly, in the process of forming the contact holes 41A, 41B by etching, the SOI substrate 10 is etched to a depth of the upper insulating film 15, but the contact hole 41B is prevented from penetrating the buried insulating film 12, by the etching barrier film 14.

Next, an exemplary method of fabricating the semiconductor device 1 of the embodiment will be explained, referring to FIG. 2 to FIG. 11 which are cross sectional views schematically illustrating processes of fabricating the semiconductor device 1 of the embodiment.

Figure 2:
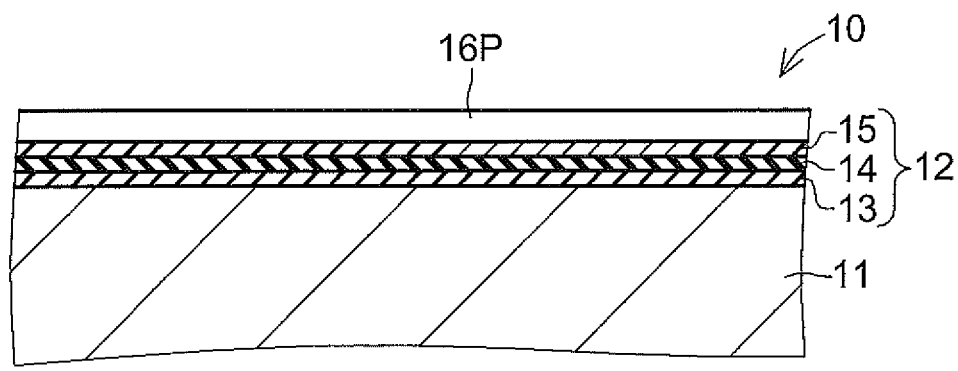
FIG. 2 to FIG. 11 are cross sectional views schematically illustrating a fabrication process of the semiconductor device of the embodiment.
Figure 3:
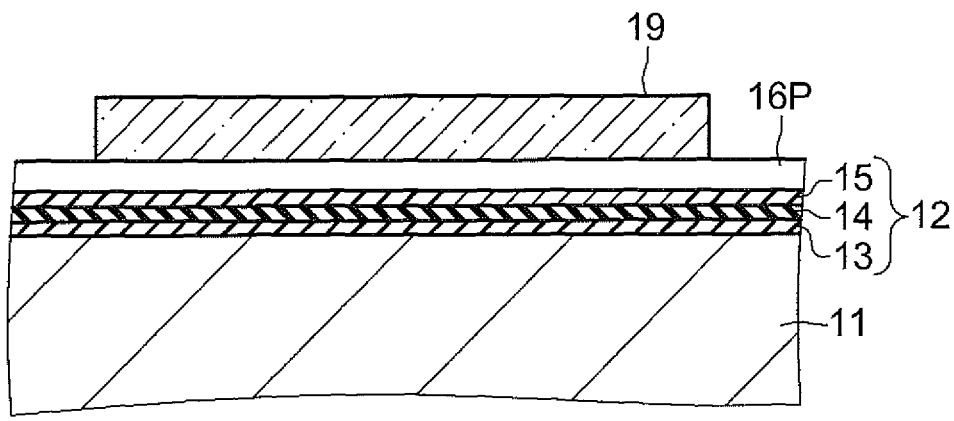

First, as illustrated in FIG. 2, the SOI substrate 10 configured by stacking the semiconductor base 11, the buried insulating film 12 and the semiconductor layer 16P is prepared. The semiconductor base 11 and the semiconductor layer 16P are composed of a single-crystalline silicon material. A method of fabricating the SOI substrate 10 will be described later. Next, a resist pattern 19, used for etching of the semiconductor layer 16P into the mesa shape, is formed on the semiconductor layer 16P by a semiconductor lithographic process using a radiation such as X-ray or EUV (Extreme Ultra Violet) (FIG. 3). The semiconductor layer 16P is then anisotropically etched using the resist pattern 19 as a mask.

Figure 4:
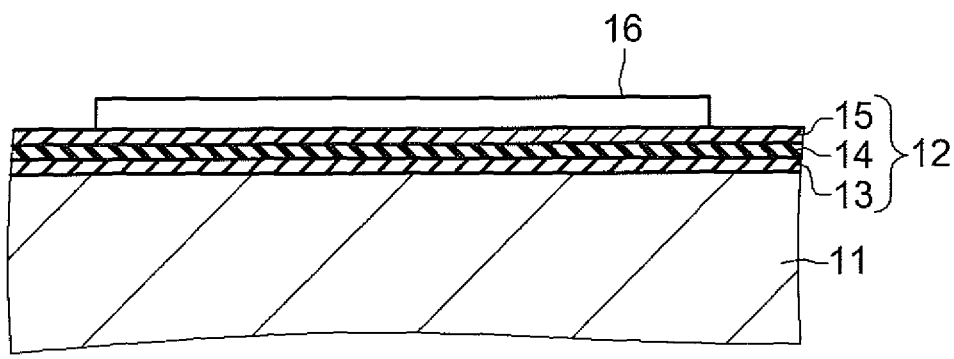

As a consequence, the semiconductor layer 16 is given in the form of mesa-shape convex portion, used as the active region, as illustrated in FIG. 4.

Figure 5:
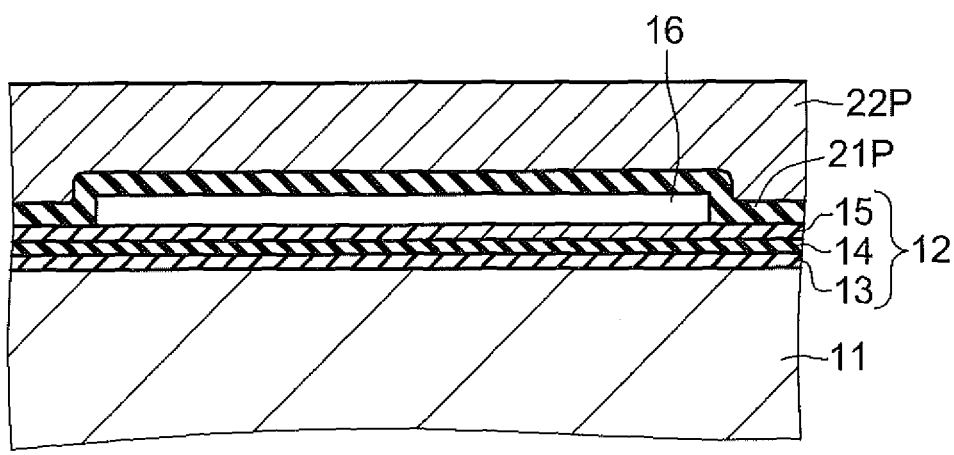
Figure 6:
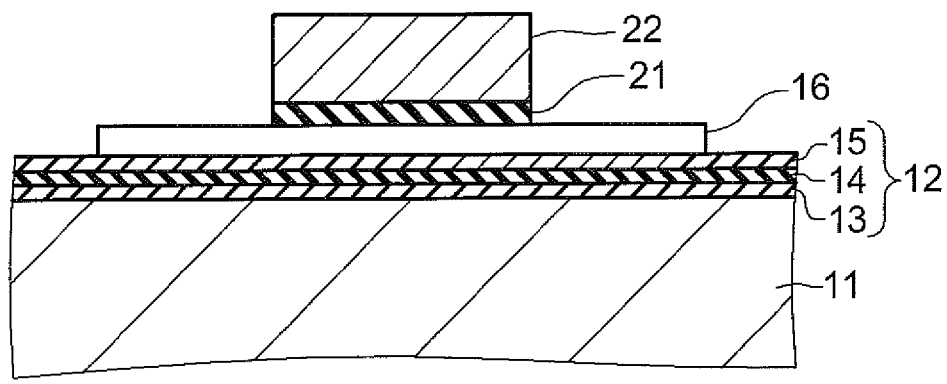

Thereafter, as illustrated in FIG. 5, typically by the CVD (Chemical Vapor Deposition) process, an insulating film 21P of several nanometers thick typically composed of a high-k material such as hafnium silicate, and an electro-conductive layer 22P of approximately 100 nm thick are sequentially formed on the structure illustrated in FIG. 4. The electro-conductive layer 22P can be formed using polysilicon or titanium nitride. Next, a resist pattern (not illustrated) is formed by photolighography on the structure illustrated in FIG. 5, followed by etching using the resist pattern as a mask, for forming the gate insulating film 21 and the gate electrode 22 as illustrated in FIG. 6. An impurity 60 is then introduced by ion implantation into the semiconductor layer 16 on both sides of the gate electrode 22, while using the gate insulating film 21 and the gate electrode 22 as a mask, and then activating the impurity to thereby form the impurity-diffused regions 16se, 16de for forming the LDD regions or extension regions.

Figure 7:
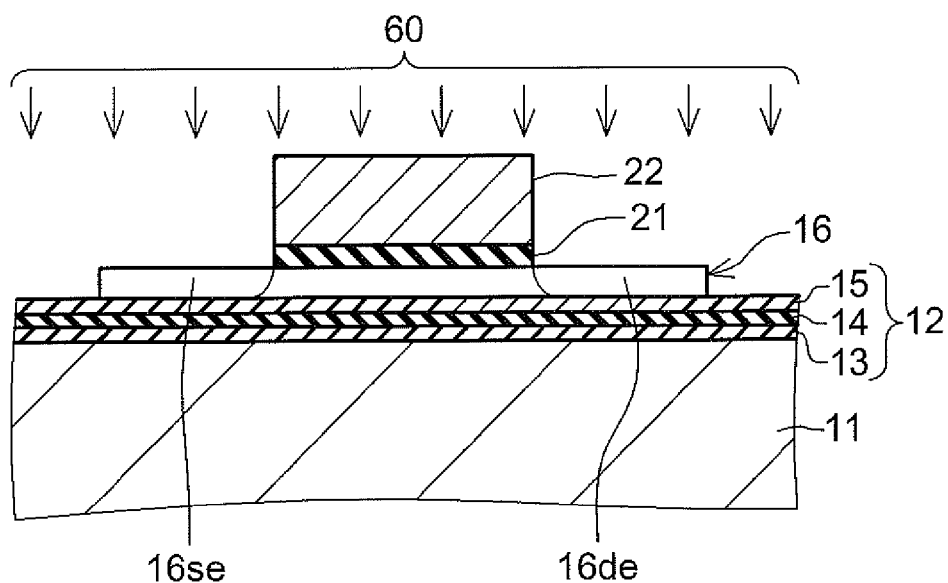
Figure 8:
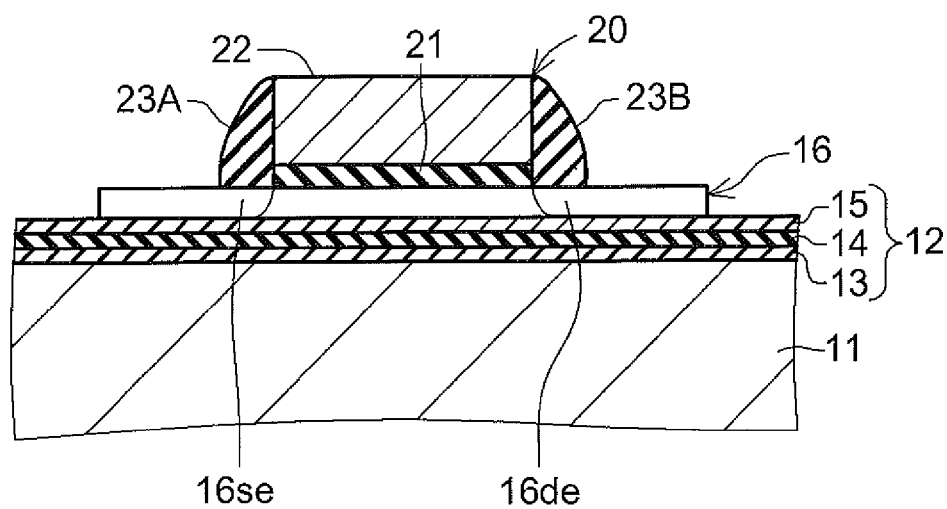

An insulating film (not illustrated) of approximately 10 nm to 300 nm thick, composed of an insulating material such as silicon oxide, is formed on the structure illustrated in FIG. 7 typically by CVD, and the insulating film is then anisotropically etched back. The sidewall spacers 23A, 23B are consequently formed on both side faces of the gate electrode 22, as illustrated in FIG. 8. The gate structure 20 is configured by the sidewall spacers 23A, 23B, the gate insulating film 21 and the gate electrode 22.

Figure 9:
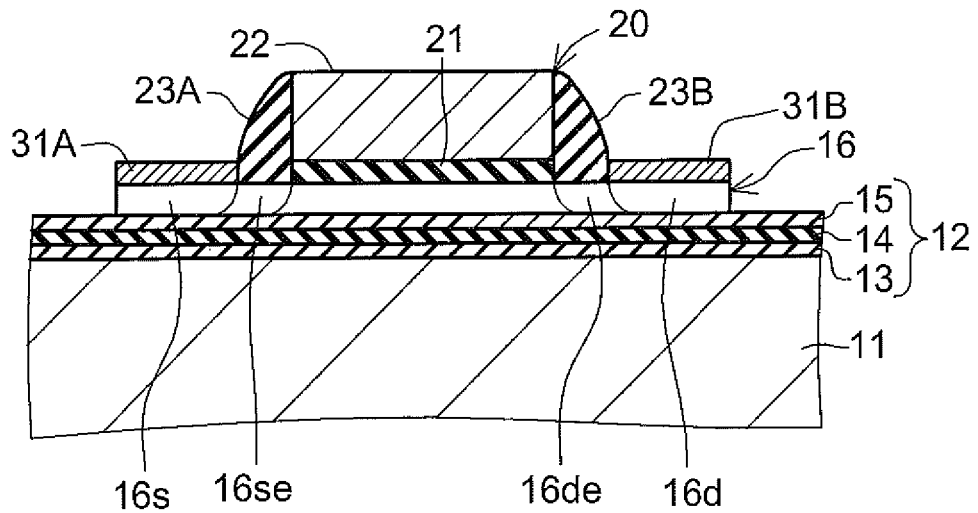
Figure 10:
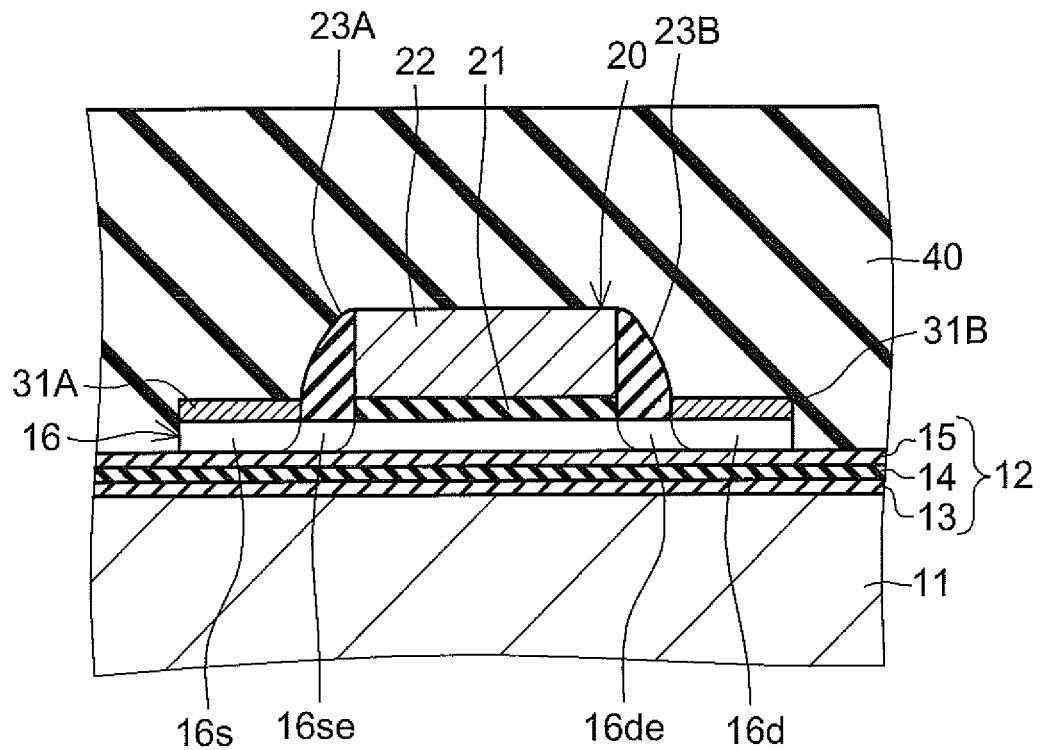

Next, the epitaxial layers 31A, 31B are formed by the selective epitaxial growth (SEG) process using the exposed surface of the semiconductor layer 16 as an underlying layer, as illustrated in FIG. 9. The selective epitaxial growth process is exemplified by CVD process using a source gas which contains a silane-based gas (silane gas, disilane gas, or dichlorosilane gas, for example) and a chlorine-containing gas. Next, an impurity is introduced by ion implantation through the epitaxial layers 31A, 31B into the semiconductor layer 16, while using the gate structure 20 as a mask, and then activating the impurity to thereby form the source diffusion region 16s and the drain diffusion region 16d on both sides of the gate structure 20. The source diffusion region 16s and the drain diffusion region 16d can be inverted vice versa.

Figure 11:
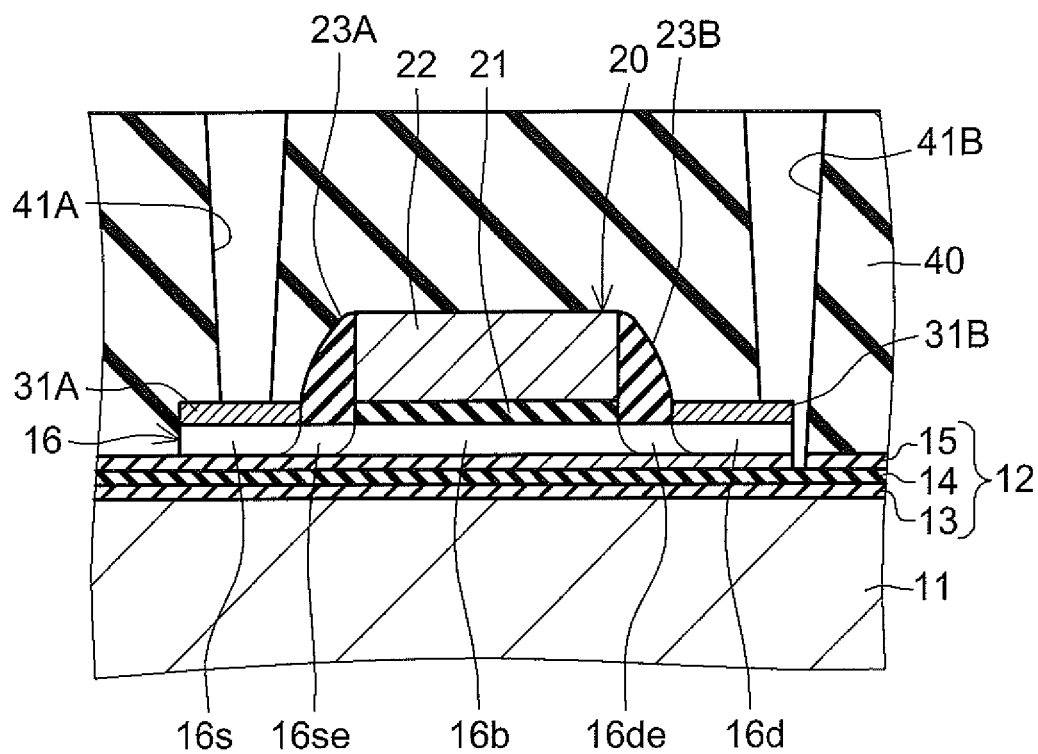

Next, an insulating interlayer 40 of approximately 500 nm to 1500 nm thick, composed of a $SiO_2$-based material, is formed typically by plasma CVD, on the structure illustrated in FIG. 9. The top surface of the insulating interlayer 40 is optionally planarized, typically by CMP (Chemical Mechanical Polishing). Next, a resist pattern (not illustrated) is formed by a semiconductor lithographic process using a radiation such as X-ray or EUV, on the insulating interlayer 40, and the insulating interlayer 40 is patterned by anisotropic etching using the resist pattern as a mask. As a consequence, as illustrated in FIG. 11, the contact holes 41A, 41B which later allows therethrough electrical connection, via the epitaxial layers 31A, 31B with the source diffusion region 16s and the drain diffusion region 16d, are formed.

For example, a barrier film typically composed of a nitride film is formed over the inner surface of the contact holes 41A, 41B, and the contact holes 41A, 41B are then filled with a refractory metal material such as tungsten, typically by CVD, to thereby form the contact plugs 42A, 42B illustrated in FIG. 1. Thereafter, the upper interconnects 50A, 50B composed of an interconnect material such as copper or aluminum are formed.

In the fabrication process of the semiconductor device 1 of the embodiment, the etching for forming the mesa-shape semiconductor layer 16 is proceeded until the top surface of the buried insulating film 12 in the SOI substrate 10 exposes, as illustrated in FIG. 3 and FIG. 4. In addition, the region for forming the contact hole 41B overlaps the region for forming the element isolation region, as illustrated in FIG. 11, due to misalignment of the reticle used in the photolithography. Accordingly, not only the insulating interlayer 40, but also the upper insulating film 15 are etched. However, since the etching barrier film 14 serves as the etching stopper, the contact hole 41B is prevented from penetrating the buried insulating film 12. Since short-circuiting between the semiconductor base 11 and the semiconductor layer (SOI layer) 16 is exactly avoidable in this way, yield ratio of the semiconductor device 1 can be improved.

For an exemplary case where the thickness of the etching barrier film 14 is approximately several nanometers to 50 nm (more preferably 5 nm to 10 nm or around), the contact hole 41B can be prevented from penetrating the etching barrier film 14, by adjusting a ratio (=R2/R1) of an etching rate of the upper insulating film 15 (=R2) relative to an etching rate of the barrier film 14 (=R1), or so-called "selectivity", to a range from 5 to 40 or around, more preferably a range from 10 to 20 or around. The present inventors experimentally confirmed that the contact hole 41B was successfully prevented from penetrating the etching barrier film 14, when the insulating interlayer (silicon oxide film) 40 was anisotropically etched while adjusting the substrate temperature to 50° C., and using an etching gas which contains $C_4F_8$ gas (flow rate: 26 sccm), Ar gas (flow rate: 500 sccm) and $O_2$ gas (flow rate: 10 sccm).

If the buried insulating film 12 is sufficiently thin, the semiconductor base 11 can be used as a back-gate. More specifically, by applying a bias voltage to the semiconductor base (supporting substrate) 11, the threshold current of the SOI transistor 1 becomes controllable, and degradation or variation in the element characteristics can be improved. For an exemplary case where the upper insulating film 15 and the lower insulating film 13 are composed of a silicon oxide film having a dielectric constant of 3.9, and the etching barrier film 14 is composed of a silicon nitride film having a dielectric constant of 7.5, the back-gate effect is supposed to be obtainable even if the thickness of the etching barrier film 14 is adjusted twice as large as the total thickness of the upper insulating film 15 and the lower insulating film 13, since the silicon nitride film has a dielectric constant approximately twice as large as that of the silicon oxide film. From the viewpoint of obtaining the back-gate effect, the upper limit of the thickness of the buried insulating film 12 as a whole is preferably adjusted, for example, to 10 nm to 20 nm or around.

It is to be noted that any material alternative to silicon nitride can be used as a constituent material for the etching barrier film 14. In this case, the thickness of the etching barrier film 14 is adjustable to a value correspondent to the ratio of dielectric constant of the material relative to the dielectric constant of silicon oxide film.

Next, a method of fabricating the SOI substrate 10 used for fabrication of the semiconductor device 1 of the embodiment will be explained with reference to FIGS. 12A, 12B, 13, and 14. FIGS. 12A, 12B, 13, and 14 are cross sectional views schematically illustrating processes for fabricating the SOI substrate 10.

Figures 12A, 12B:
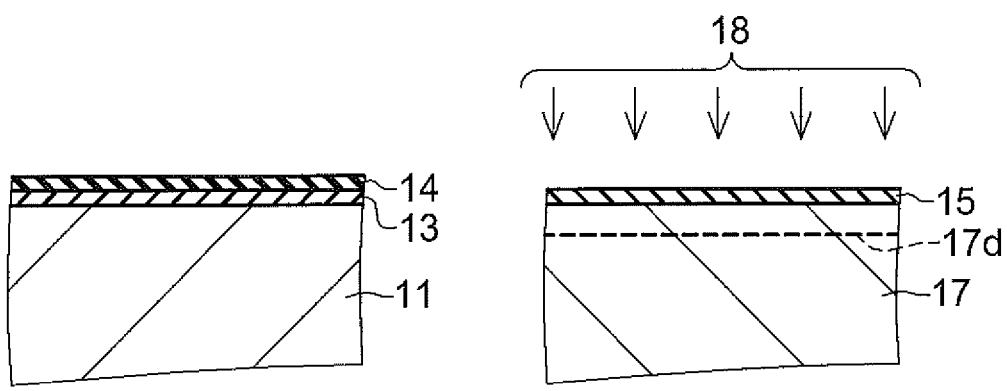

First, as illustrated in FIG. 12A, the main surface of the semiconductor base 11, which is a single-crystalline silicon wafer, is thermally oxidized to thereby form a lower insulating film (thermal oxide film) 13. Next, the etching barrier film 14 composed of a nitride film is formed typically by CVD, on the lower insulating film 13. On the other hand, as illustrated in FIG. 12B, the main surface of another semiconductor base 17, which is composed of a single-crystalline silicon material, is thermally oxidized to thereby form the upper insulating film (thermal oxide film) 15. Hydrogen ion 18 is then bombarded through the upper insulating film 15 into the semiconductor base 17, to thereby form a defect layer 17d which distributes at a predetermined depth (0.1 µm to several micrometers deep from the surface, for example).

Figure 13:
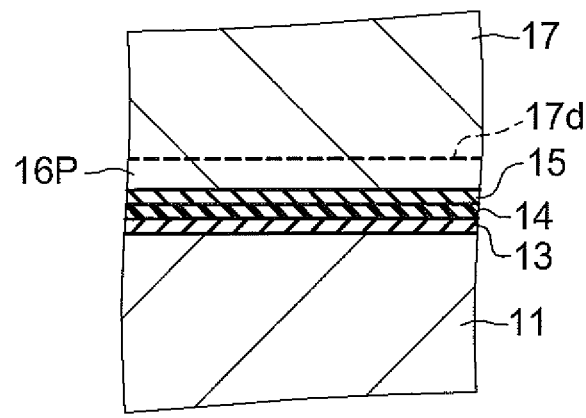

Next, as illustrated in FIG. 13, the etching barrier film 14 on the semiconductor base 11 and the upper insulating film 15 on the semiconductor base 17 are bonded. The bonded article is annealed, and then split at the defect layer 17d so as to separate the semiconductor layer 16P from the semiconductor base 11, to thereby produce the SOI substrate 10 illustrated in FIG. 14. The surface of the semiconductor layer 16P is polished if necessary.

Figure 14:
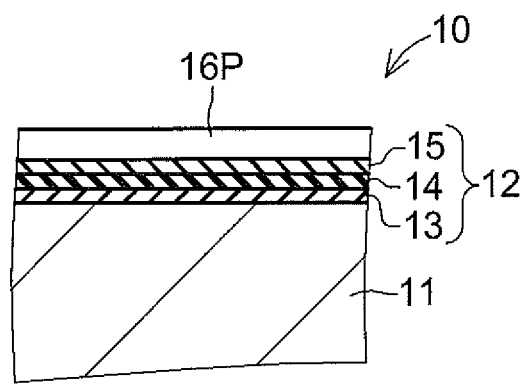

In the SOI substrate 10 illustrated in FIG. 14, the etching barrier film 14 is held between the lower insulating film 13 and the upper insulating film 15. The configuration is aimed at suppressing surface state between the nitride film and silicon from affecting the element characteristics. For the case where the surface state between the nitride film and silicon hardly affects the element characteristics, either one or both of the lower insulating film 13 and the upper insulating film 15 are omissible.

Figure 15:
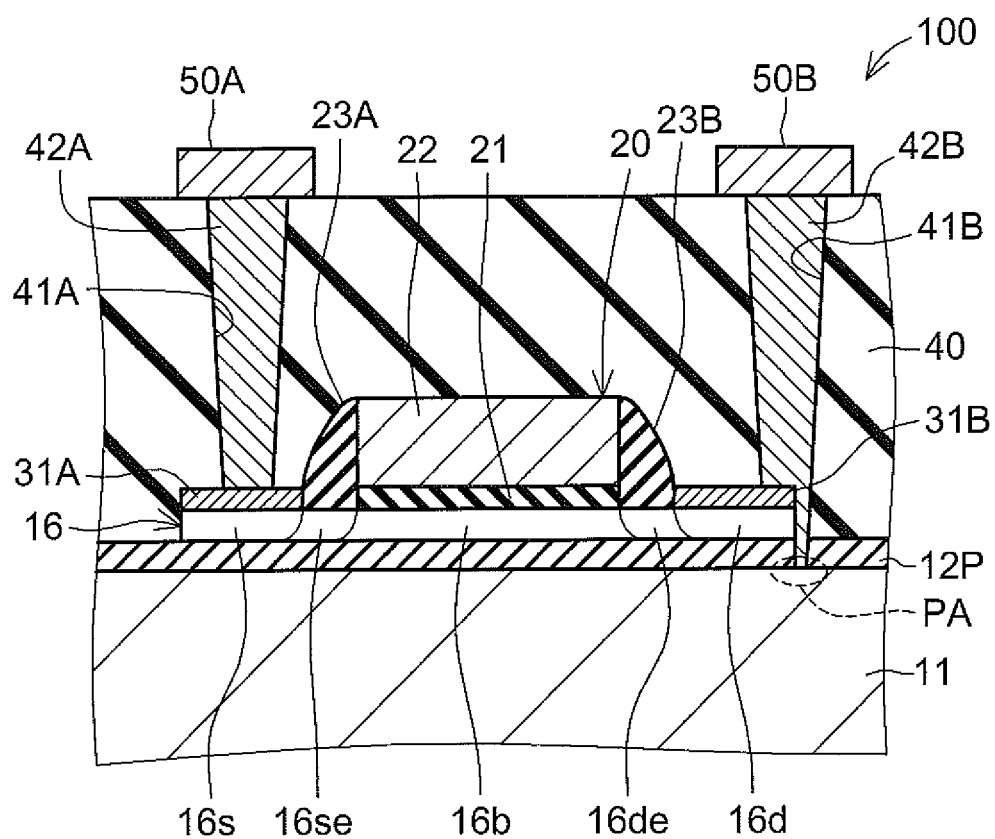
FIG. 15 is a cross sectional view schematically illustrating a structure of a semiconductor device according to a comparative example.

As explained in the above, since the semiconductor device 1 of the embodiment is fabricating using the SOI substrate 10 having the buried insulating film 12 which contains a nitride film, so that the contact hole 41B can be prevented from penetrating the buried insulating film 12, even if the region for forming the contact hole 41B overlaps the element isolation region. FIG. 15 is a cross sectional view schematically illustrating a structure of a semiconductor device 100 according to a comparative example. The structure illustrated in FIG. 15 is same as that of the semiconductor device 1 of the embodiment, except that the buried insulating film 12P is composed only of a silicon oxide film. As illustrated in FIG. 15, since the semiconductor device 100 have no etching barrier film, the contact hole 41B penetrates the buried insulating film 12P to reach the upper region of the semiconductor base 11. There can be a problem of causing short-circuiting between the semiconductor base 11 and the semiconductor layer 16, and producing defective products.

In contrast, the semiconductor device 1 of the embodiment can successfully prevent the penetration of the buried insulating film 12 by the contact hole 41B, even if the SOI substrate 10 having an extremely thin buried insulating film 12 is used for the purpose of implementing the back-gate effect. Accordingly, the short-circuiting between the semiconductor base 11 and the semiconductor layer 16 is avoidable, and thereby the yield ratio of the semiconductor device 1 can be improved.

While the embodiments of the present invention were explained referring to the attached drawings, they are merely for the exemplary purposes, without precluding any other various configurations to be adopted. For example, while the embodiments described in the above adopted the SOI transistor structure based on the mesa isolation process, also an SOI transistor structure having an element isolation insulating film formed by the STI or LOCOS process, in place of the mesa isolation process, can prevent the contact hole from penetrating the buried insulating film in the SOI substrate, similarly to the embodiment described in the above.

Figure 16:
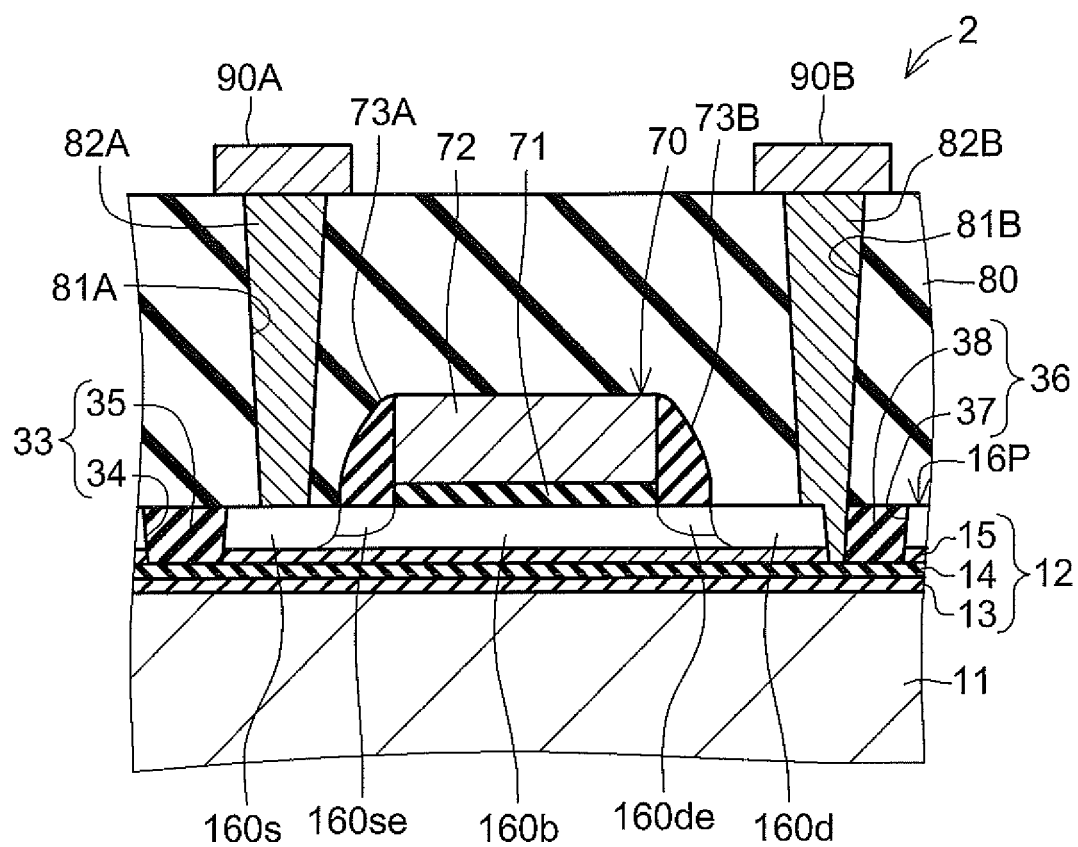
FIG. 16 is a cross sectional view schematically illustrating a structure of a semiconductor device according to another embodiment of the present invention.

FIG. 16 is a cross sectional view schematically illustrating an exemplary configuration of a semiconductor device 2 having STI structures 33, 34 for forming the element isolation region. In the semiconductor device 2, the STI structures 33, 36 extend from the top surface of the semiconductor layer 16P towards the buried insulating film 12. One STI structure 33 has a trench 34 and an element isolation insulating film 35 composed of a $SiO_2$-based material filled in the trench 34, and also the other STI structure 36 has a trench 37 and an element isolation insulating film 38 composed of a $SiO_2$-based material filled in the trench 37.

The method of fabricating the STI structures 34, 37 is not specifically limited, and instead any widely-known process can be used. For example, a silicon oxide film and a silicon nitride film are sequentially formed on the SOI substrate 10 illustrated in FIG. 2, and silicon oxide film and the silicon nitride film and the SOI substrate 10 are selectively removed by using photolithographic technique and etching technique, to thereby form the trenches 34, 37 for element isolation. The inner wall of the trenches 34, 37 are then thermally oxidized. An insulating film typically composed of silicon oxide is then deposited by CVD in the trenches 34, 37. The top surface of the insulating film is then planarized by, for example, CMP (chemical mechanical polishing, or chemical mechanical planarization). The silicon oxide film and the silicon nitride film are then removed respectively by wet etching. As a result of these processes, the STI structures 33, 36 illustrated in FIG. 16 can be formed.

A gate structure 70 which is composed of a gate insulating film 71, a gate electrode 72 and sidewall spacers 73A, 73B, is formed in the region on the semiconductor layer 16P which falls within the STI structures 33, 36. On both sides of the gate structure 70, a source diffusion region 160s and a drain diffusion region 160d are formed. Also extension regions 160se, 160de are formed so as to extend respectively from the source diffusion region 160s and the drain diffusion region 160d towards the region directly under the gate electrode 72. A body region 160b herein refers to a region surrounded by the source diffusion region 160s, the drain diffusion region 160d, the extension regions 160se, 160de, and the buried insulating film 12.

In the semiconductor device 2, an insulating interlayer 80 composed of a $SiO_2$-based material is formed so as to cover the gate structure 70, the semiconductor layer 16P, and the STI structures 33, 36. In the insulating interlayer 80, contact holes 81A, 81B which respectively reach the top surface of the source diffusion region 160sa and the top surface of the drain diffusion region 160d are formed, and the contact holes 81A, 81B are respectively filled with contact plugs 82A, 82B composed of a refractory metal material such as tungsten or tantalum. The upper ends of the contact plugs 82A, 82B are electrically connected respectively to upper interconnects 90A, 90E.

Now as illustrated in FIG. 16, a region for forming the contact hole 81B overlaps the STI structure 36, due to misalignment of a reticle used in the lithographic process. For this reason, the element isolation insulating film 38 is etched to a depth of the etching barrier film 14 when the contact holes 81A, 81B are formed by etching. The contact hole 81B is, however, prevented from penetrating the buried insulating film 12, by the etching barrier film 14.

While the semiconductor device I of the embodiment and the semiconductor device 2 in the modified embodiment have the gate structures 20, 70 on the SOI substrates, the present invention is not limited thereto. Even if the region for forming the contact hole accidentally overlaps the element isolation region, in configurations having semiconductor element structures other than the gate structures 20, 70 formed on the SOI substrate 10, the contact hole can be prevented from penetrating the buried insulating film 12.

According to the present invention, since the nitride film acts as an etching stopper, even if the SOI substrate should accidentally be etched in the element isolation region due to misalignment of the contact holes formed in the insulating interlayer, so that element characteristics can be suppressed from degrading.

It is apparent that the present invention is not limited to the above embodiments, that can be modified and changed without departing from the scope and spirit of the invention.

What is claimed is:

1. A semiconductor device comprising:
    an SOI substrate; and
    a semiconductor element structure formed on the SOI substrate,
    the SOI substrate including:
    a semiconductor base;
    a semiconductor layer formed over the semiconductor base; and
    a buried insulating film which is disposed between the semiconductor base and the semiconductor layer, so as to electrically isolate the semiconductor layer from the semiconductor base, the buried insulating film containing a lower insulating film formed on the semiconductor base, a nitride film formed on the lower insulating film, and an upper insulating film formed on the nitride film,
    the semiconductor element structure including:
    a gate structure having a gate insulating film formed on the semiconductor layer and a gate electrode formed on the gate insulating film;
    an insulating interlayer which is formed on the semiconductor layer of the SOI substrate and on the gate structure and has a contact hole formed therein; and
    a contact plug with which the contact hole is filled, the contact plug being electrically connected to the semiconductor layer, and
    the semiconductor layer including:
    first and second impurity-diffused regions which have a same conductivity type and are formed on both sides of the gate structure, respectively; and
    a body region which is formed between the first and second impurity-diffused regions and directly under the gate structure; and
    wherein,
    either one of the first and second impurity-diffused regions is electrically connected to the contact plug, and
    a bias voltage is applied to the semiconductor base when the semiconductor base is used as a back-gate.

2. The semiconductor device according to claim 1, wherein the nitride film is a silicon nitride film.

3. The semiconductor device according to claim 2, wherein the lower insulating film and the upper insulating film are silicon oxide film.

4. The semiconductor device according to claim 3, wherein the silicon oxide film is a thermal oxide film.

5. The semiconductor device according to claim 3, wherein the nitride film is a film formed on the lower insulating film by the chemical vapor deposition process.

6. The semiconductor device according to claim 1, wherein:
    a region in which the contact hole is formed overlaps an element isolation region; and
    the semiconductor layer has a mesa-shaped convex portion which defines the element isolation region.

7. The semiconductor device according to claim 6, wherein bottom ends of side faces of the mesa-shaped convex portion reach a top surface of the buried insulating film.

8. The semiconductor device according to claim 1, further comprising an element isolation insulating film which extends depthwisely from a top surface of the semiconductor layer towards the buried insulating film,
    wherein a region in which the contact hole is formed overlaps a region in which the element isolation insulating film is formed.

9. The semiconductor device according to claim 1, further comprising an epitaxial layer which is disposed between the semiconductor layer and the contact plug, and is formed using the semiconductor layer as an underlying layer.

10. The semiconductor device according to claim 1, wherein an upper limit of a thickness of the buried insulating film as a whole is 10 nm to 20 nm.

11. A method of manufacturing a semiconductor device comprising:
    preparing the SOI substrate of claim 1; and
    forming the semiconductor element structure of claim 1 on the SOI substrate.

12. The method of manufacturing a semiconductor device according to claim 11, wherein said forming the semiconductor element structure includes:
    depositing the insulating interlayer on the semiconductor layer of the SOI substrate;
    forming the contact hole by selectively etching the insulating interlayer under a predetermined etching condition; and
    filling the contact hole with the contact plug which is electrically connected with the semiconductor layer.

13. The method of manufacturing a semiconductor device according to claim 12, further comprising forming the first and second impurity-diffused regions by introducing an impurity of the same conductivity type into the semiconductor layer, wherein:
    said forming the semiconductor element structure further includes forming the gate structure which includes the gate insulating film and the gate electrode on the semiconductor layer; and
    the first and second impurity-diffused regions are regions formed on the both sides of the gate structure by introducing the impurity into the semiconductor layer using the gate structure as a mask.

14. The method of manufacturing a semiconductor device according to claim 13, further comprising forming a mesa-shaped convex portion which determines an element isolation region, by selectively etching the semiconductor layer,
    wherein a region for forming the contact hole overlaps the element isolation region.

15. The method of manufacturing a semiconductor device according to claim 14, wherein said selectively etching the semiconductor layer is performed until bottom ends of side faces of the mesa-shaped convex portion reach a top surface of the buried insulating film.

16. The method of manufacturing a semiconductor device according to claim 15, further comprising forming an element isolation insulating film which extends depthwisely from a top surface of the semiconductor layer towards the buried insulating film,
    wherein a region for forming the contact hole overlaps a region for forming the element isolation insulating film.

17. The method of manufacturing a semiconductor device according to claim 12, further comprising forming, in advance of formation of the contact hole, an epitaxial layer by the selective epitaxial growth process using the semiconductor layer as an underlying layer, wherein the contact hole is formed to fall on the epitaxial layer.

18. A method of manufacturing an SOI substrate comprising:

preparing a first semiconductor base which includes a semiconductor layer;

forming an insulating film which includes a nitride film, on a main surface of a second semiconductor base; and bonding the insulating film on the second semiconductor base and the semiconductor layer of the first semiconductor base, the insulating film being formed so as to electrically isolate the semiconductor layer from the second semiconductor base.

19. The method of manufacturing an SOI substrate according to claim 18, further comprising:

forming a defect layer which contains defects distributed therein at a predetermined depth, by implanting impurity ions into the first semiconductor base; and separating the semiconductor layer from the first semiconductor base, after said bonding, by splitting the first semiconductor base at the defect layer.

20. The method of manufacturing an SOI substrate according to claim 18, wherein the nitride film is a silicon nitride film.

21. The method of manufacturing an SOI substrate according to claim 18, wherein said forming the insulating film includes:

forming an oxide film on the main surface of the second semiconductor base; and forming the nitride film on the oxide film, the oxide film being a silicon oxide film.

22. The method of manufacturing an SOI substrate according to claim 21, wherein the oxide film is formed by thermally oxidizing the main surface of the second semiconductor base.

23. The method of manufacturing an SOI substrate according to claim 21, wherein the nitride film is formed by chemical vapor deposition on the oxide film.

* * * * *